SELECTIVE CHEMICAL DEPOSITION OF THIN-FILM INTERCONNECTIONS AND CONTACTS

Filed Aug. 22, 1967

INVENTORS M. A. DE ANGELO
M. W. SAGAL
D. J. SHARP
BY MARN & JANGARATHIS
ATTORNEYS 3,485,665
Patented Dec. 23, 1969

3,485,665

SELECTIVE CHEMICAL DEPOSITION OF THIN-FILM INTERCONNECTIONS AND CONTACTS

Michael Anthony De Angelo, Hamilton Square, Matthew Warren Sagal, Berkeley Heights, and Donald Jex Sharp, Princeton, N.J., assignors to Western Electric Company, Incorporated, New York, N.Y., a corporation of New York Filed Aug. 22, 1967, Ser. No. 662,461
Int. Cl. B44d *1/18;* C23b *5/50*
U.S. Cl. 117—212 16 Claims

ABSTRACT OF THE DISCLOSURE

After deposition of tantalum or tantalum nitride on a substrate and etching to form a desired thin film circuit pattern, the resistor portions of the circuit are anodized. A relatively thick anodic oxide layer is formed on the resistor portion of the circuit and a relatively thinner, oxide layer forms naturally on the unanodized portions of the film circuit, i.e., the contact pad and conductor portions. The circuit is then etched under conditions controlled to remove the relatively thinner, oxide layer, but not the relatively thicker, anodic oxide layer. The film circuit is thereafter immersed in an electroless sensitizing solution which sensitizes only the oxide-free portions of the circuit. The circuit is then electrolessly plated with a metal to deposit an electrically conducting metal on the oxide-free, sensitized portions of the film circuit. Masking of the (anodized) resistor portions of the circuit prior to plating is thus eliminated. In a preferred embodiment of the invention, the etching and sensitizing steps are carried out with a single solution.

BACKGROUND OF THE INVENTION

Field of the invention

This invention relates generally to a technique for electrolessly plating conductors on film forming materials and, more particularly, it relates to forming contact pads and interconnections on thin film circuits. The method of the invention involves chemically depositing electrically conductive metals selectively on bare metal surfaces, but without the necessity of masking other circuit elements. As used herein, the term "thin film" is generally intended to mean a film of less than two microns (20,000 A.) thickness.

Thin film resistors, conductors and other circuit elements are formed of patterned resistive or conductive coatings applied to dielectric substrates. Such materials as glass, ceramics and plastics are suitable substrates. Contact pads and conductive interconnections are thereafter applied to the dielectric substrate in electrical contact with said resistive or conductive coatings. As circuit elements, film-forming or anodizable metals are preferably employed. These include tantalum, niobium, silicon, aluminum, titanium, zirconium and alloys thereof.

Prior art

The typical prior art procedure for forming a tantalum thin film circuit involves the following steps. First, tantalum nitride is reactively sputtered onto a glass substrate in a continuous layer. The tantalum nitride is then patterned in the desired resistor configuration by use of photolithographic etch resists and etchants. A metal mask is then placed over the surface having openings positioned over desired contact pads and interconnections, and a conductive metal or metals is evaporated onto the surface through the mask. Deposition of Ni-Cr followed by Cu-Pd is typical. Alternatively, a conductive layer or layers can be applied over the entire surface, followed by selective etching to form contact pads and interconnections. At this point, the resistor portions of the circuit are selectively anodized to achieve the proper resistance value, by any one of a variety of methods. A resist may be used to cover other portions of the circuit, as described in U.S. Patent No. 3,148,129 issued Sept. 8, 1964 to H. Bassaches et al., assigned to Bell Telephone Laboratories. A capillary anodizing fixture may be employed, as described in co-pending U.S. patent application Ser. No. 346,243, now Patent No. 3,361,662 to R. D. Sutch, or a viscous electrolyte capable of being silk-screened in a pattern may be used, as set forth in co-pending U.S. patent application Ser. No. 564,332, now Patent No. 3,445,353 of A. J. Harendza-Harinxma.

Whether the contact pads and interconnections are applied by etching a continuous layer or evaporating metal through a mask, two problems which have been persistent are precision and expense. The number of steps involved in applying a continuous metallic layer, photolithographically applying a negative resist, etching and so forth means that this process is inherently expensive. Evaporation through a mask is a simpler process, but line definition is not as exact. As circuit patterns grow smaller and the demand for high-quality, volume production rises, these problems become more acute.

OBJECTS AND SUMMARY OF THE INVENTION

It is a general object of the present invention to provide an improved method of electrolessly plating conductive metals on film-forming materials.

It is a further object of this invention to provide an improved method of applying a patterned electrically conductive coating on a thin film circuit.

It is another object of this invention to provide a simple and inexpensive method of applying conductive elements to thin film circuit patterns with improved pattern discrimination.

Yet another object of the invention is to provide an improved electroless plating method of applying conductive elements to thin film circuits.

Various other objects and advantages of this invention will become clear from the following description, and the novel features will be particularly pointed out in connection with the appended claims.

The essence, the present invention involves a selective chemical deposition of electrically conductive metals on desired portions of a pre-formed pattern of a film-forming metal. Initially, the entire pattern is deposited on a substrate, either by applying a layer of metal and etching the pattern, or by initially masking the substrate and applying the layer in the desired pattern. An anodizing mask is then applied to the pattern covering portions thereof where anodizing is not desired. The resistor portions are then anodized to a desired thickness, and the mask is removed. Due to the high affinity of film forming metals for oxygen, a very thin oxide film unavoidably forms on other portions of the pattern. Thereafter, the pattern is etched slightly to remove all of this thin oxide layer and an equal amount of the thicker anodic oxide layer. The proportion of the anodic oxide layer removed in this operation will be only a few percent. The substrate is then immersed in an electroless metal-sensitizing solution which only sensitizes the etched, oxide-free portions of the pattern. The pattern is then plated with an electroless metal to deposit a layer of an electrically conducting metal only on the oxide-free, sensitized portions thereof. In a preferred embodiment of the invention, the etching and sensitizing steps are carried out simultaneously by combining their constitutents in one solution.

Thin-film circuit contacts and interconnectors produced in accordance with the invention are conveniently and easily produced by simple immersion processes using electroless plating formulations common to the art, and without the use of masks or photolithography. The contact pads and interconnectors have good adhesion and conductivity characteristics, and pattern discrimination is extremely good.

BRIEF DESCRIPTION OF THE DRAWINGS

Understanding of the invention will be facilitated by referring to the following detailed discussion and the accompanying drawings, wherein.

DESCRIPTION OF EMBODIMENTS

Figure 1:
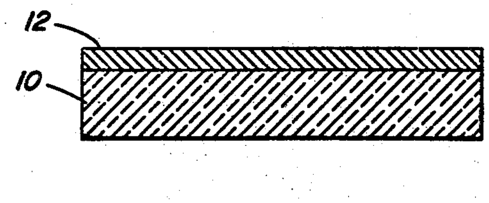
FIGURES 1–5 are cross-sectional elevations of a coated substrate, greatly enlarged, illustrating the successive steps of the invention.
Figure 2:
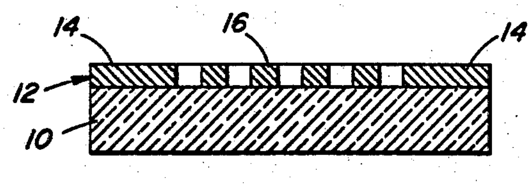

As shown in FIGURE 1, a glass substrate 10 initially has a layer 12 of tantalum or tantalum nitride applied thereon. This may be done by any well-known method, such as vacuum deposition, reactive sputtering or the like. Next, an etch-resistant mask in a pattern corresponding to the desired circuit pattern is formed on top of tantalum layer 12. A suitable etchant is used to removed portions of layer 12 not covered by the mask. Illustratively, as shown in FIGURE 2, the resultant pattern may comprise two conductor portions 14 and a zig-zag resistor 16. Preferred techniques of pattern forming, including suitable masking materials and etchants, are described in detail in co-pending U.S. patent application Ser. No. 409,656, now Patent No. 3,406,043, J. W. Balde. Other techniques are well known in the art. It is to be noted that the pattern can also be applied to the substrate by initially laying down a negative mask of the pattern, depositing the metal layer, and then removing the mask and metal adherent thereto. In either case, the results are identical; a pattern of the desired circuit is applied on the substrate.

Figure 3:
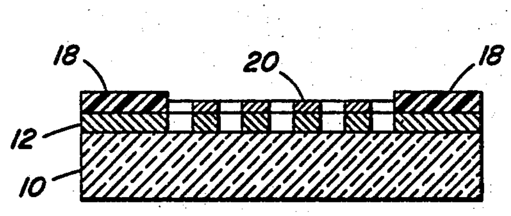

The next step is to anodize resistor 16, and this can be done by a variety of methods, as noted hereinabove. For example, a suitable mask 18 may be applied over the portions of the circuit intended to be conductors, leaving resistor pattern 16 exposed. The entire piece is then anodized, forming a layer 20 of tantalum pentoxide ($Ta_2O_5$) on the surface of the resistor 16. The structure immediately after anodizing is illustrated in FIGURE 3.

Figure 4:
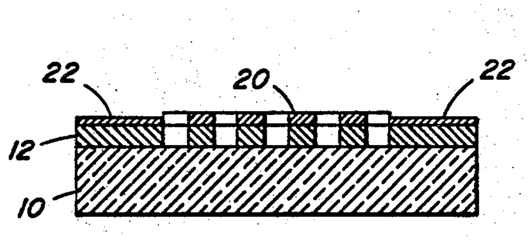

The resist 18 is next removed, as shown in FIGURE 4. Due to the affinity of film forming metals for oxygen, tantalum in particular, it is inevitable that a thin tantalum pentoxide film 22 will form on the portions of the pattern intended to be conductors. This may only be 1–10 A. thick, but its presence is essentially impossible to prevent. However, this naturally occurring oxide film will in all cases be several orders of magnitude thinner than the anodic oxide film formed on the resistor patterns, so it is possible to place the entire piece in an etching solution effective on tantalum pentoxide, and entirely remove the thin, natural oxide film 22 from the conductor portions of the pattern while only removing a relatively negligible amount of $Ta_2O_5$ 20 from the resistor patterns. This comprises the next step of the invention. The anodic oxide film, for example, is generally at least 200 A. thick and frequently is as thick as 2000 A. Aqueous sodium hydroxide and nitric-hydrofluoric acid mixtures are well known etchants for $Ta_2O_5$, and the time of immersion used is just sufficient to completely remove film 22. The HP–$HNO_3$ mixture is preferred over NaOH, as it etches natural oxides faster than anodically grown oxides. However a mixture of HF and acetic acid is particularly preferred, because of its slower rate of attack on metallic tantalum.

The piece is removed from the etch solution, rinsed, and immediately dipped into a sensitizing solution. It will be appreciated that exposure of the etched surface to the atmosphere for more than a few seconds will result in the reformation of an oxide film, and should thus be avoided. As a sensitizer, a solution of a palladium salt is preferred, since essentially any electroless plating solution will plate out metal on a palladium-sensitized surface. As a solvent for the palladium sensitizer, acetic acid is preferred, as it results in more uniform sensitization. The sensitizer electro-galvanically deposits an extremely thin coating of palladium, just a few atomic layers, on the exposed tantalum surface, which catalytically initiates the subsequent electroless plating step. The piece is rinsed after immersion in the sensitizer to wash off the excess solution; this does not affect the palladium layer.

Figure 5:
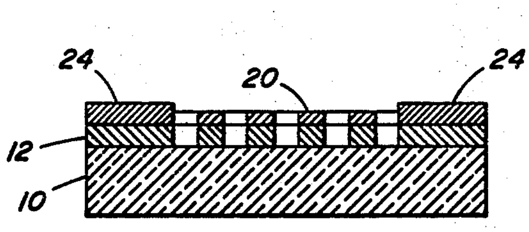

The piece is then immersed by any suitable electroless plating solution. Nickel plates out very well and is preferred, but other metals can also be plated in this manner. The initial plating may be followed by subsequent electroless or electro-plating of other metals or combinations until the desired thickness for the contact pads, conductors, etc. is reached. The finished piece is shown in FIGURE 5, with conductor layer 24 in the desired position. Adhesion of the plated metal layer is improved by a brief heat treatment.

In a preferred embodiment of the invention, the etching and sensitizing steps are combined. For example, the HF–$HNO_3$ mixture may be added to a palladium, chloride solution. The acid does not attack palladium, and it has been found that, in this solution, the acid first removes the tantalum pentoxide and the palladium then sensitizes the fresh surface. There is no chance for reoxidation of the tantalum surface. Further, the palladium deposit on the tantalum surface protects it from oxidation, so no special speed or other precautions are necessary when transferring the piece from the etch/sensitizer solution to the plating solution. For obvious reasons, it is preferred to use the palladium chloride-acetic acid sensitizer solution and the HF-acetic acid etch solution when preparing a combined etch/sensitizer solution.

Figure 6:
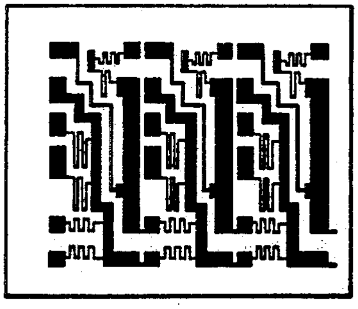
FIGURE 6 is a plan view of a typical circuit pattern produced by the method of the invention.

The accuracy of pattern discrimination achieved by the method of the invention is remarkable. Measurements have indicated that the plated metal conforms to the desired pattern within the order of one micron. Moreover, pattern discrimination is not lessened when the anodic oxide films are very thin. As is well known, the thickness of an anodic oxide film is a function of the anodization voltage. It has been determined that perfect discrimination can be achieved with the method of the invention when anodization is carried out at as little as two volts. The process of the invention also eliminates the need for the separate, protective anodizing step commonly required in prior processes. FIGURE 6 illustrates the intricate type of circuit pattern which can be formed by the invention; resistor areas are indicated by zig-zag patterns and conductor and compact pad areas are solid.

The invention will now be illustrated by specific examples, which are intended to be illustrative only and should not be interpreted in a limiting sense.

Example I

A thin-film circuit was prepared on a glass substrate. A tantalum layer, 6000 A. thick, was applied to the substrate by sputtering at 4000 v. (the thickness of the tantalum is unimportant).

A layer of Kodak photoresist was applied in the conventional manner and a pattern was shaped in such a way as to expose a desired resistor network pattern of unprotected tantalum.

The unprotected tantalum was anodized in a 0.01% citric acid solution at room temperature. Anodizing potential was brought to 130 volts. The resulting $Ta_2O_5$ layer was about 2000 A. thick.

The residual photoresist was removed with a conventional solvent. Because of the high affinity of tantalum for oxygen, a relatively thin layer of tantalum oxide formed naturally on the now exposed, unanodized portions of the patterned film.

The pattern film was washed with a potassium-dichromate-sulfuric acid cleaning solution at a temperature of about 27° C. The washing time was from about 2 to 5 minutes, after which the film was washed thoroughly with cold tap water.

Tantatlum oxide was removed by etching with a saturated aqueous solution of sodium hydroxide at a temperature of from about 65° C. to 70° C. The film was etched for a time sufficient to remove all of the naturally formed oxide layer, but not the much thicker anodic oxide layer (from about 1 to 3 minutes). The film was washed thoroughly with tap water, to remove all traces of the caustic.

The film was thereafter immediately immersed in an electroless nickel sensitizing solution. A diamino or tetraamino palladium chloride solution is preferred, because it is more active, but ordinary palladium chloride is operable. In this distance, dilute aqueous palladium chloride (from about 0.01% to 0.05%) was employed at a temperature of about 25° C., and for a time period of about 1 to 2 minutes, whereupon the oxide-free portions of the pattern were sensitized with palladium. The film was washed thoroughly with (1) tap water, and (2) deionized water. It is essential that the time between the etching step and the sensitization step be kept to a minimum (15–20 seconds) so as to prevent reoxidation of the clean tantalum surfaces.

The film was thereafter immersed in an electroless nickel plating solution at a temperature of from about 75° C. to 85° C., for a time period of from about 2 to 10 minutes. Plating time is varied depending on the thickness desired. A nickel plate was formed on the palladium sensitized portions of the pattern. The film was washed thoroughly with (1) tap waer, and (2) deionized water.

The film was thereafter immersed in an electroless gold plating solution at a temperature of from about 75° C. to 85° C., and for a time period of from about 5 to 20 minutes, again depending on the desired thickness. A gold plate was formed on the nickel plated portions of the pattern. The film was washed thoroughly with tap water and dried.

The film was then heat-treated at a temperature of about 250° C. for 60 minutes.

Example II

Approximately 1500 A. of tantalum nitride were reactively sputtered onto a glass substrate. This layer was patterned by applying a positive resist and etching. A resist was then applied over the contact pad and connector portions, and the resistor portions were anodized. The resists were removed, the piece was washed and immersed successively in an HF-acetic acid etch solution, a palladium chloride sensitizer, an electroless nickel solution and an electroless gold solution, with a water wash between each step. After drying the completed circuit it was heated to 350° F. for 15 minutes to improve adhesion.

Example III

A patterned film circuit was prepared according to the process detailed in Example I, except that the oxide etching operation and the electroless nickel sensitizing operation were combined into one step. The problem of preventing undesired reoxidation of the clean tantalum surfaces is overcome by combining the etching constituent, a dilute aqueous solution of HF and acetic acid (from about 1% to 5% each, respectively), and the sensitizing constituent, dilute aqueous palladium chloride (from about 0.01% to 0.05%).

In operation, the sensitizing constituents are inactive until the etchant effects the removal of the metal oxide, whereupon the clean metal is immediately sensitized. Other combinations of etchant and sensitizing solutions known in the art may be combined and utilized according to this invention. The only requirement is that the etchant not excessively attack the sensitizing metal so as to effect the integrity of sensitized areas.

The plated metal surfaces produced in all of the above examples exhibited good conductivity characteristics (less than 0.1 ohm/square), supported perpendicular pull strengths of 2000 p.s.i., and soldered with ease.

In addition to the described nickel and gold plating baths, many combinations of plating bath constituents can be used. One familiar with the art can readily select the suitable electroless plating solution for the purposes of this invention. Other metals which lend themselves to the process of this invention, which make good electrical interconnections and which are readily solderable or otherwise bondable, include copper, silver and palladium. The metals may be utilized in various layered combinations such as Ni-Pd, Ni-Au-Pd, Ni-Cu, Cu-Ni-Au, Cu-Au-Pd, or the metals may be utilized alone as a single layer.

What is claimed is:

1. A process of plating selective portions of a layer of film-forming metal having a relatively thin, naturally grown oxide of the metal thereover, which comprises the steps of:

(a) oxidizing those portions of the layer which are not to be plated to form an oxide thereon of a thickness substantially greater than that of the naturally grown oxide;

(b) subjecting the layer to an etchant for a time sufficient to remove all of the naturally grown oxide, but insufficient to remove all of the oxide formed in step (a), so that the portions to be plated are rendered oxide free, while an oxide covers the portions not to be plated;

(c) subjecting the layer to a plating sensitizer which sensitizes the oxide-free portions of the layer only and not the oxide-covered portions thereof; and (d) subjecting the layer to a plating solution of a metal which will deposit on the sensitized portions of the layer but not the oxide-covered portions thereof, and thereby plate only the sensitized portions of the layer with the metal.

2. The process as defined in claim 1, wherein steps (b) and (c) are carried out simultaneously in a combined etchant-sensitizer.

3. A process for applying conductors and contact pads to a preformed circuit pattern composed of film-forming metal and including resistor portions which comprises:

forming a relatively thick metallic oxide layer on the resistor portions of said circuit and a relatively thin metallic oxide layer on the remaining portions of said circuit, said remaining portions defining desired conductor and contact pad areas;

removing the relatively thin oxide layer from said remaining portions to expose clean metal portions;

sensitizing said clean metal portions of said circuit; and electrolessly depositing an electrically conducting metal upon and in intimate contact with said sensitized metal portions of said circuit.

4. The process as defined in claim 3, wherein said thick oxide layer is grown anodically and said thin oxide layer is formed upon exposure to air.

5. The process as defined in claim 3, wherein said sensitizing is carried out by immersing said circuit in a solution of a palladium salt.

6. The process as defined in claim 3, wherein said electrolessly deposited metal is nickel, and additionally comprising electrolessly depositing a layer of gold over said nickel.

7. The process as defined in claim 3, wherein said thin oxide layer is removed by immersing said circuit in an etchant comprising an aqueous mixture of hydrofluoric and acetic acids.

8. The process as defined in claim 7, wherein said etching of said thin oxide layer to expose clean metal portions, and said sensitizing of said clean metal portions is accomplished in a single step utilizing a combined etching and sensitizing solution.

9. The process as defined in claim 8, wherein said etching and sensitizing solution comprises an aqueous solution of from about 1% to 5% hydrofluoric acid, from about 1% to 5% acetic acid and from about 0.01% to 0.05% palladium chloride by weight.

10. A process for fabricating a thin-film circuit on a substrate, said circuit including resistor portions and conductive contact pad and interconnection portions, said process comprising the steps of:

(a) forming the pattern of said circuit on said substrate with a suitable, film-forming material;
(b) anodizing to form a relatively thick anodic oxide coating on said resistor portions only;
(c) allowing a relatively thin oxide coating to form on said contact pad and interconnection portions by exposure to air;
(d) removing said thin oxide coating by etching, thereby exposing the underlying material;
(e) immersing the circuit in a sensitizing solution, said solution acting only on said exposed material; and
(f) immersing said circuit in an electroless plating solution, whereby a layer of metal is deposited only on said exposed material.

11. The process as defined in claim 10, wherein steps (d) and (e) are carried out simultaneously.

12. The process as defined in claim 10, wherein said film-forming material is tantalum.

13. The process as defined in claim 10, wherein said material is tantalum nitride.

14. The process as defined in claim 10, wherein said sensitizer is a solution of a palladium salt and said etchant is an aqueous mixture of acetic and hydrofluoric acids.

15. The process as defined in claim 10, wherein step (f) is repeated at least once to deposit an additional layer of metal on said first layer.

16. The process as defined in claim 10, and additionally comprising heating the finished circuit, whereby adhesion of the plated metal to the underlying material is improved.

References Cited

UNITED STATES PATENTS

| | | | |
|---|---|---|---|
| 3,387,952 | 6/1968 | La Chapelle | 112—217 |
| 3,300,339 | 1/1967 | Perri et al. | 117—212 X |
| 3,256,588 | 6/1966 | Sikina et al. | 117—212 X |
| 3,193,418 | 7/1965 | Cooper et al. | 156—17 X |

ALFRED L. LEAVITT, Primary Examiner

A. GRINALDI, Assistant Examiner

U.S. Cl. X.R.

117—217; 156—7, 17